(12) United States Patent
Kasahara

(10) Patent No.: US 10,847,191 B2
(45) Date of Patent: Nov. 24, 2020

(54) SEMICONDUCTOR DEVICE

(71) Applicant: TOSHIBA MEMORY CORPORATION, Tokyo (JP)

(72) Inventor: Yusuke Kasahara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/553,505

(22) Filed: Aug. 28, 2019

(65) Prior Publication Data

US 2020/0234735 A1    Jul. 23, 2020

(30) Foreign Application Priority Data

Jan. 21, 2019  (JP) .................. 2019-007517

(51) Int. Cl.
| | |
|---|---|
| *G11C 5/06* | (2006.01) |
| *H01L 45/00* | (2006.01) |
| *H01L 27/24* | (2006.01) |
| *H01L 23/528* | (2006.01) |

(52) U.S. Cl.
CPC ............ *G11C 5/063* (2013.01); *H01L 23/528* (2013.01); *H01L 27/2463* (2013.01); *H01L 45/1233* (2013.01); *H01L 45/1675* (2013.01)

(58) Field of Classification Search
CPC ..... H01L 23/481; H01L 23/52; H01L 23/528; H01L 23/535; H01L 27/0207; G11C 5/063
See application file for complete search history.

(56) References Cited

U.S. PATENT DOCUMENTS

| | | | |
|---|---|---|---|
| 8,391,042 B2* | 3/2013 | Lee .................. | G11C 16/04 365/63 |
| 8,644,046 B2* | 2/2014 | Seol ................ | H01L 27/11551 365/51 |
| 8,791,448 B2* | 7/2014 | Kim ................. | G11C 11/16 257/5 |
| 9,535,329 B2 | 1/2017 | Pimenta Barros et al. | |
| 2008/0308954 A1* | 12/2008 | Seo ................. | H01L 27/10855 257/786 |
| 2010/0038616 A1 | 2/2010 | Nagashima et al. | |
| 2017/0263511 A1 | 9/2017 | Tedeschi | |
| 2017/0263551 A1 | 9/2017 | Briston et al. | |
| 2019/0043754 A1 | 2/2019 | Brink et al. | |

FOREIGN PATENT DOCUMENTS

| | | |
|---|---|---|
| JP | 2010045205 A | 2/2010 |
| JP | 2011077475 A | 4/2011 |
| JP | 2014154829 A | 8/2014 |

* cited by examiner

*Primary Examiner* — Allison Bernstein
(74) *Attorney, Agent, or Firm* — Kim & Stewart LLP

(57) ABSTRACT

A semiconductor device includes a first pattern comprising first lines at a first interval and second pattern at the first interval. The second lines are between the first lines. A third pattern is above the first and the second patterns in a first and second areas. The third pattern includes third portions spaced from each other at the first interval in the first area and fourth portions spaced from each other at the first interval in the second area. The third portions are directly above the second lines in the first area and the fourth portions are directly above the first lines in the second area. A first contact is between third portions in the first area and connected to a first line of the first pattern. A second contact is between the fourth portions in the second area and connected to a second line of the second pattern.

20 Claims, 16 Drawing Sheets

US 10,847,191 B2

SEMICONDUCTOR DEVICE

CROSS-REFERENCE TO RELATED APPLICATION

This application is based upon and claims the benefit of priority from Japanese Patent Application No. 2019-007517, filed on Jan. 21, 2019, the entire contents of which are incorporated herein by reference.

FIELD

Embodiments described herein relate generally to a semiconductor device.

BACKGROUND

Along with the miniaturization of semiconductor devices, shrinkage of wiring for the semiconductor devices is also in progress. In this context, there is a problem regarding how to form contacts to which periodically arranged fine wiring is connected one by one as in wiring having a line-and-space pattern.

DETAILED DESCRIPTION

In general, according to one embodiment, a semiconductor device comprises a first periodic pattern comprising first line portions that extend in a first direction and are spaced from each other in a second direction intersecting the first direction at a first interval and a second periodic pattern comprising second line portions that extend in the first direction and are spaced from each other in the second direction at the first interval, the second line portions being between the first line portions in the second direction at one-half the first interval. A third pattern is above the first and the second periodic patterns in a third direction intersecting the first and second directions. In a first area, the third pattern includes third line portions spaced from each other in the second direction at the first interval, the third line portions being directly above the second line portions in the third direction within the first area. In a second area, spaced from the first area in the first direction, the third pattern includes fourth line portions spaced from each other in the second direction at the first interval. The fourth line portions are directly above the first line portions in the third direction within the second area. A first contact is between the third line portions in the first area and is connected to a first line portion of the first pattern. A second contact is between the fourth line portions in the second area and connected to a second line portion of the second pattern.

Hereinafter, the present disclosure will be described in detail with reference to the drawings. It should be noted that the present disclosure is not limited by the following example embodiments. In addition, the following embodiments include those variations and equivalents apparent to those skilled in the art.

In general, additional miniaturization is desired for semiconductor devices. Along with this, shrinkage of wiring used the semiconductor devices is also in progress. When a storage element, a logic element, or the like are arranged in an array, then often the associated wiring has a line-and-space pattern with a narrow pitch and there is a problem regarding how to connect a contact individually to each wiring.

A semiconductor device in which a contact can be directly connected to fine wiring at a narrow pitch will be described by taking a cross-point type memory that uses a variable resistance element or the like in a memory cell as one possible, non-limiting particular example. In other examples, the semiconductor device may be devices other than cross-point type memory.

(Configuration Example of Semiconductor Device)

Figure 1:
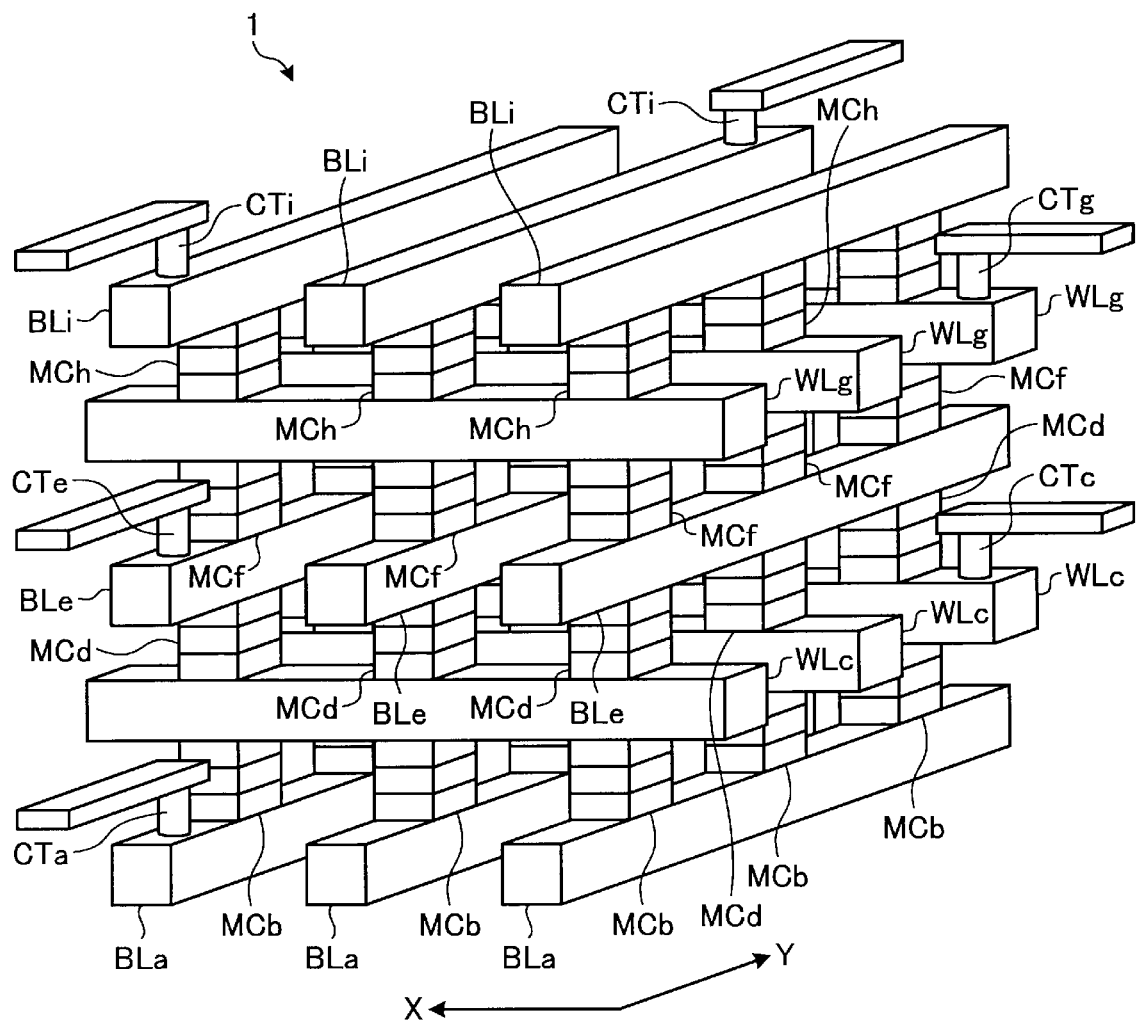
FIG. 1 is a perspective view of a semiconductor device according to an embodiment.

FIG. 1 is a perspective view showing an overall configuration example of a semiconductor device 1 according to an embodiment. As shown in FIG. 1, the semiconductor device 1 has a structure in which a plurality of memory cells are sandwiched between a plurality of bit lines and a plurality of word lines. These memory cells, bit lines, and word lines are stacked in multiple layers. The semiconductor device 1 is configured as a cross-point type memory that uses variable resistance elements in the memory cells. Memory cells stacked in four layers are shown in FIG. 1; however, the memory cells may be stacked in any number of layers.

A plurality of bit lines BLa at a lowermost layer extend in a Y direction and are arranged at a predetermined pitch in an X direction intersecting with the Y direction. Above the plurality of bit lines BLa, a plurality of word lines WLc, extend in the X direction and are arranged at a predetermined pitch in the Y direction. Above the plurality of word lines WLc, a plurality of bit lines BLe, extend in the Y direction and are arranged at the predetermined pitch in the X direction. Above the plurality of bit lines BLe, a plurality of word lines WLg, extend in the X direction and are arranged at the predetermined pitch in the Y direction. Above the plurality of word lines WLg, a plurality of bit lines BLi, extend in the Y direction and are arranged at the predetermined pitch in the X direction.

In this way, the bit lines and the word lines extend in directions that intersect with each other. The pitch of the bit lines and the pitch of the word lines are, for example, equal. The bit lines and the word lines are formed of, for example, tungsten (W).

A plurality of memory cells MCb between the plurality of bit lines BLa and the plurality of word lines WLc. Each memory cell MCb is connected to a bit line BLa and a word line WLc. A plurality of memory cells MCd are between the plurality of word lines WLc and the plurality of bit lines BLe. Each memory cell MCd is connected to a word line WLc and a bit line BLe. A plurality of memory cells MCf are between the plurality of bit lines BLe and the plurality of word lines WLg. Each memory cell MCf is connected to a bit line BLe and a word line WLg. A plurality of memory cells MCh are between the plurality of word lines WLg and the plurality of bit lines BLi. Each memory cell MCh is connected to a word line WLg and a bit line BLi.

A contact CTa is connected to each bit line BLa. Though not specifically depicted, each contact CTa is connected to an electrode pad, an upper layer wiring, or the like. A contact CTc is connected to each word line WLc. Though not specifically depicted, each contact CTc is connected to an electrode pad, an upper layer wiring, or the like. A contact CTe is connected to each bit line BLe. Though not specifically depicted, each contact CTe is connected to an electrode pad, an upper layer wiring, or the like. A contact CTg is connected to each word line WLg. Though not specifically depicted, each contact CTq is connected to an electrode pad, an upper layer wiring, or the like. A contact CTi is connected to each bit line BLi. Though not specifically depicted, each contact CTi is connected to an electrode pad, an upper layer wiring, or the like. The contacts CTa, CTc, CTe, CTg, CTi are formed of, for example, tungsten (W). In FIG. 1, for sake graphical clarity, not all the contacts CTa, CTc, CTe, CTg, CTi are depicted.

Figure 2:
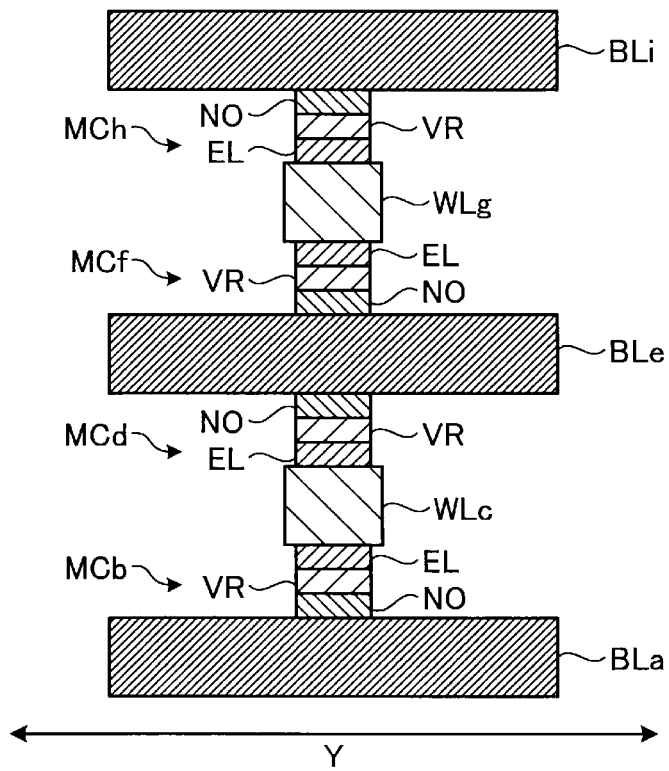
FIG. 2 is a cross-sectional view of a memory cell according to an embodiment.

FIG. 2 shows a cross-sectional view showing a configuration example of memory cells according to an embodiment. FIG. 2 shows a cross-sectional view parallel to the Y direction in FIG. 1.

As shown in FIG. 2, the memory cell MCb has a structure in which a non-ohmic element NO, a variable resistance element VR and an electrode EL are stacked in an order from a bit line BLa side toward a word line WLc side. The non-ohmic element NO is connected to the bit line BLa, and the electrode EL is connected to the word line WLc. The memory cell MCd has a structure in which the electrode EL, the variable resistance element VR and the non-ohmic element NO are stacked in an order from the word line WLc side toward a bit line BLe side. The electrode EL is connected to the word line WLc, and the non-ohmic element NO is connected to the bit line BLe. Between the bit line BLe and the bit line BLi, a configuration similar to that of the memory cells MCb, MCd is repeated by the memory cells MCf, MCh with the word line WLg sandwiched therebetween.

The non-ohmic element NO has a Schottky structure, a PN structure, a P$^+$ Poly-Silicon-Intrinsic-N$^+$ Poly-Silicon (PIN) structure, a Metal-Insulator-Metal (MIM) structure, or a Poly-Si-Insulator-Poly-Si (SIS) structure.

The variable resistance element VR is an element capable of storing data in a nonvolatile manner by changing a resistance value via a current, heat, or chemical energy switching or the otherwise upon application of a voltage. A composite compound containing a cation of a transition element, for example, may be used in the variable resistance element VR. Examples of the composite compound include materials having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$) and a perovskite structure ($AMO_3$). In this case, the variable resistance element VR is configured as a Resistive Random Access Memory (ReRAM) or the like whose resistance value is changed by movement of cations.

Platinum (Pt), gold (Au), silver (Ag), titanium aluminum nitride (TiAlN), strontium ruthenium oxide (SrRuO), ruthenium (Ru), ruthenium nitride (RuN), iridium (Ir), cobalt (Co), titanium (Ti), titanium (TiN), tantalum nitride (TaN), lanthanum niobium oxide (LaNiO), aluminum (Al), platinum iridium oxide $PtIrO_x$, $OsRhO_x$, Rh/TaAlN, or the like may be used in the electrode EL.

(Connection Example of Semiconductor Device)

Figure 3:
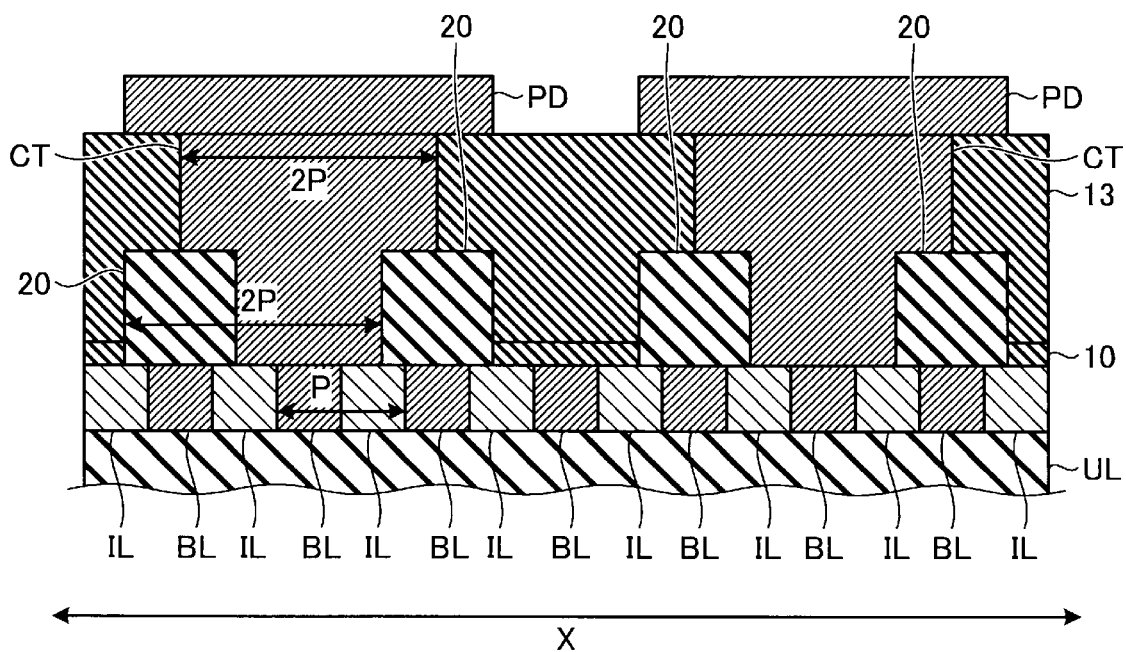
FIG. 3 is a cross-sectional view depicting a connection example of a bit line in a semiconductor device according to an embodiment.

Next, a connection example of the bit lines and the word lines in the semiconductor device 1 of an embodiment will be described with reference to FIGS. 3 and 4. FIG. 3 is a cross-sectional view of the semiconductor device 1. FIG. 3 is a cross-sectional view parallel to the X direction in FIG. 1.

The bit lines BLa, BLe and BLi have the same connection structure, and the bit lines BL shown in FIG. 3 may be any of the bit lines BLa, BLe and BLi. Further, the contacts CT shown in FIG. 3 are any one of the contacts CTa, CTe and CTi connected to any of the bit lines BLa, BLe and BLi. In FIG. 3, a lower structure of the bit line BL is depicted in a simplified manner as an under layer UL. Hereinafter, a connection example of the semiconductor device 1 will be described by taking a bit line BL as an example. It should be noted that the word lines WLc and WLg also have a connection structure similar to that of the bit lines BL.

As shown in FIG. 3, the bit lines BL are arranged at a predetermined pitch P on the under layer UL. In the example of FIG. 3, the bit line BL has a line-and-space structure in which width of the bit line BL in the X direction and an interval between adjacent bit lines BL are equal. The bit line BL has a fine width and the pitch P, which are equal to or less than an exposure limit of an immersion exposure lithography machine that uses, for example, an ArF excimer laser as a light source. An interlayer insulation layer IL is disposed between the bit lines BL.

A stopper layer 20 is disposed on the bit line BL, for example, every other bit line BL so as to cover a bit line BL. That is, stopper layers 20 are disposed in the X direction at a pitch (2P) that is twice the pitch (P) of the bit lines BL. The stopper layer 20 is formed of, for example, silicon nitride (SiN).

The contact CT is connected, for example, to every fifth bit line BL (or at bit lines at a 4 P pitch). An upper end of the contact CT has a diameter of 2 P, that is, twice the pitch of the bit lines BL. However, the contact CT is disposed between the stopper layers 20, and portions of a lower end of the contact CT are on shoulder portions of the stopper layers 20. Therefore, the lower end of the contact CT is not in contact with the bit lines BL that are on each side of the bit line BL to which the contact CT is connected.

An electrode pad PD is connected to the upper end of the contact CT. Upper layer wiring (not separately depicted) is connected to the electrode pad PD, and the bit line BL is connected to the upper layer wiring via the contact CT and the electrode pad PD. However, in some embodiments the upper layer wiring may be directly connected to the upper end of the contact CT without a distinct electrode pad disposed therebetween.

A guide layer 10 is disposed on the bit lines BL that are between positions of adjacent stopper layers 20 and to which a contact CT is not connected. The guide layer 10 is formed of, for example, silicon oxide ($SiO_2$). An interlayer insulation layer 13 is disposed between stopper layers 20 so as to cover the guide layer 10 and portions of the stopper layers 20. The interlayer insulation layer 13 is formed of, for example, $SiO_2$.

The bit lines BL are grouped in groups of four, so that all the bit lines BL can be connected to a contact CT. This is shown in FIG. 4 by the repeating groups of contacts CT-1, CT-2, CT-3, and CT-4.

Figure 4:
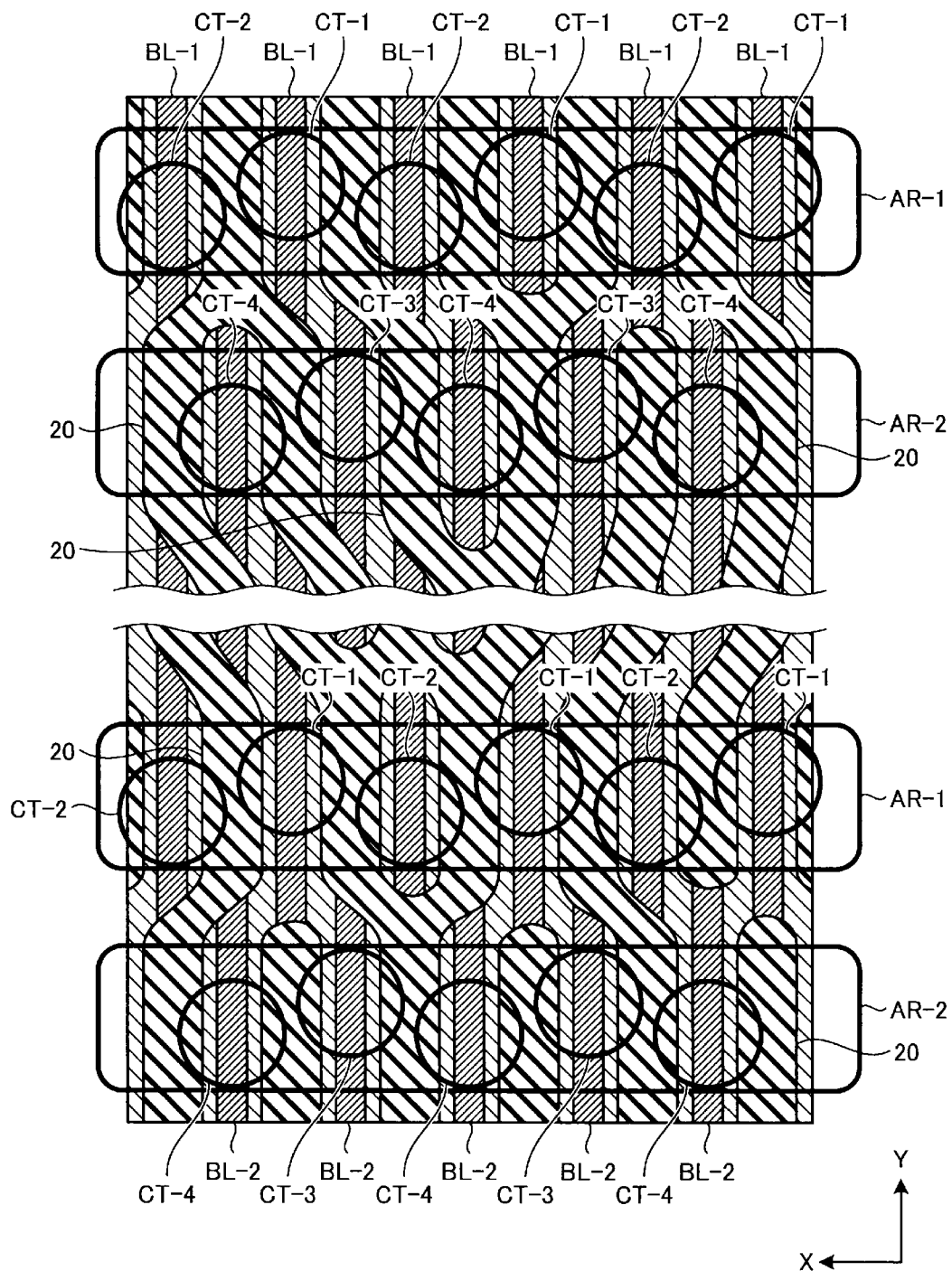
FIG. 4 is a plan view showing a connection example of bit lines in a semiconductor device according to an embodiment.

In the plan view of FIG. 4, a range wider than that of the cross-sectional view of FIG. 3 is shown. In FIG. 4, the guide layers 10, the interlayer insulation layers 13, the contacts CT, and the electrode pads PD are omitted. In FIG. 4, positions of the contacts CT are indicated by circles.

As shown in FIG. 4, the contacts CT are arranged groups of four at both end portions of sets of four adjacent bit lines BL.

Specifically, contacts CT-1 are on a first row and contacts CT-2 are on a second row. The contacts CT-1 and contacts CT-2 are in an area AR-1 and are connected to the bit lines BL-1. The rows of contacts CT-1 and contacts CT-2 are partially offset from one another in the Y-direction.

Contacts CT-3 are on a third row and contacts CT-4 are on a fourth row The contacts CT-3 and contacts CT-4 are in an area AR-2 and are connected to bit lines BL-2. The rows of contacts CT-3 and contacts CT-4 are partially offset from one another in the Y-direction.

The contacts CT-1 and the contacts CT-2 alternate with each other along the X direction such that adjacent bit lines BL-1 are connected to a different one of a contact CT-1 or a contact CT-2. The bit lines BL-2 are between the bit lines BL-1, and the bit lines BL-2 are connected to the contacts CT-3 and the contacts CT-4 in alternation such that adjacent bit lines BL-2 are connected to a different one of a contact CT-3 or a contact CT-4.

The stopper layers 20 as third patterns are arranged on the bit lines BL in parallel in the Y direction along the bit lines BL in at least the area AR-1 or area AR-2. However, outside the areas AR-1, AR-2, the stopper layers 20 partially or entirely deviate from the bit lines BL, and have an irregular arrangement like ridge lines of the fingerprint. However, the pitch of the stopper layers 20 is substantially constant inside and outside the areas AR-1, AR-2. The pitch of the stopper layers 20 may be a pitch which is twice the pitch (P) of the bit lines BL, that is, a pitch equal to pitch 2 P.

More specifically, in the area AR-1, stopper layers 20 are disposed on the bit lines BL-2 and are spaced from each other at the pitch 2 P in the X direction. Accordingly, the bit lines BL-1 are electrically connected to the contacts CT-1, CT-2, while the bit lines BL-2 are not in contact with the contacts CT-1, CT-2. In the area AR-2, stopper layers 20 are disposed on the bit lines BL-1 and are spaced from each other at a pitch 2 P in the X direction. Accordingly, the bit lines BL-2 are electrically connected to the contacts CT-3, CT-4, while the bit lines BL-1 are not in contact with the contacts CT-3, CT-4.

The guide layer 10 (see FIG. 3) is disposed on the bit lines BL and the interlayer insulation layers IL in areas other than where the stopper layers 20 are disposed.

(Example of Manufacturing Processing of Semiconductor Device)

Next, an example of manufacturing processing of a semiconductor device 1 of an embodiment will be described with reference to FIGS. 5A to 5C, 6A and 6B, 7A and 7B, 8A and 8B, 9A and 9B, 10A and 10B, 11A and 11B, 12A and 12B, 13A to 13C, 14A and 14B, 15A and 15B, 16A and 16B, and 17A and 17B.

Figure 5A:
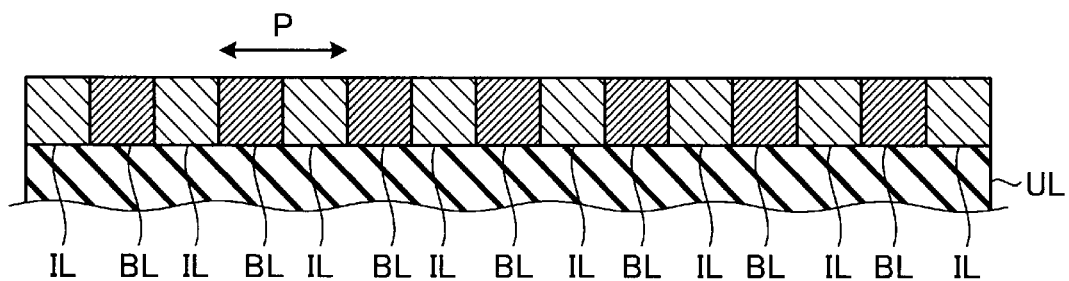
FIGS. 5A, 5B, and 5C depict aspects of a manufacturing process of a semiconductor device according to an embodiment.

As shown in FIG. 5A, the bit lines BL having the predetermined pitch P are formed on the under layer UL. The pitch P of the bit lines BL is equal to or less than the exposure limit of the immersion exposure machine (e.g., stepper) that uses, for example, an ArF excimer laser as a light source. Bit lines BL having a pitch P equal to or less than the exposure limit may be formed by using a sidewall process such as a Self-Aligned Quadruple Patterning (SAQP) or Directed Self-Assembly (DSA) lithography or the like. Alternatively, bit lines BL may be formed by using a nanoimprint technique, an Extreme Ultra-Violet (EUV) lithography technique, or the like. The sidewall process and the directed self-assembly lithography processes will be described in this example, but, in general, method of initial patterning is not a limitation of the present disclosure.

An insulation layer is formed so as to cover the formed bit lines BL. The insulation layer is planarized by using, for example, Chemical Mechanical Polishing (CMP) to form the interlayer insulation layer IL that is embedded between the bit lines BL.

Figure 5B:
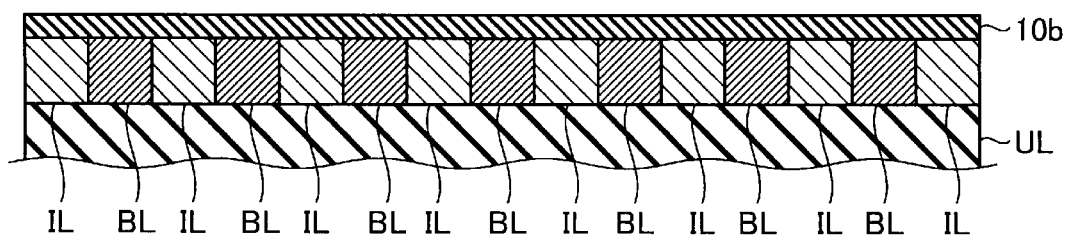

As shown in FIG. 5B, an insulation layer 10b is formed by, for example, Chemical Vapor Deposition (CVD). The insulation layer 10b is, for example, a $SiO_2$ layer.

Figure 5C:
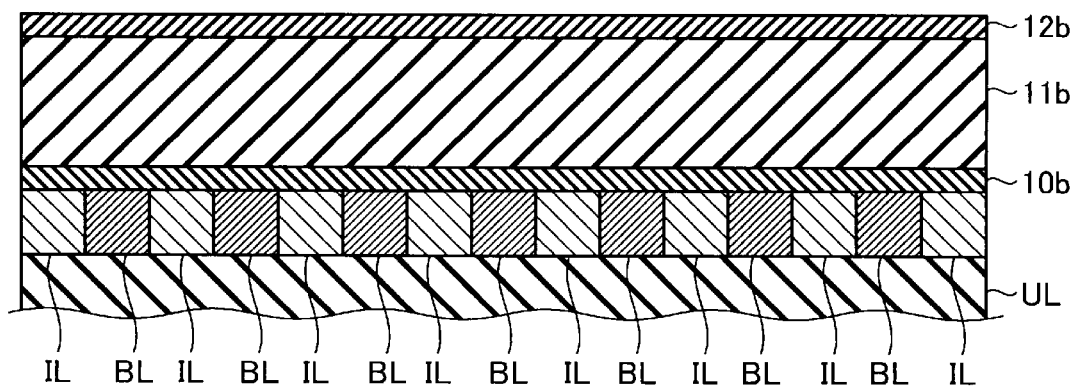

As shown in FIG. 5C, a Spin on Carbon (SOC) layer 11b is formed on the insulation layer 10b by, for example, spin coating. A Spin on Glass (SOG) layer 12b is formed on the SOC layer 11b by, for example, spin coating.

Figure 6A:
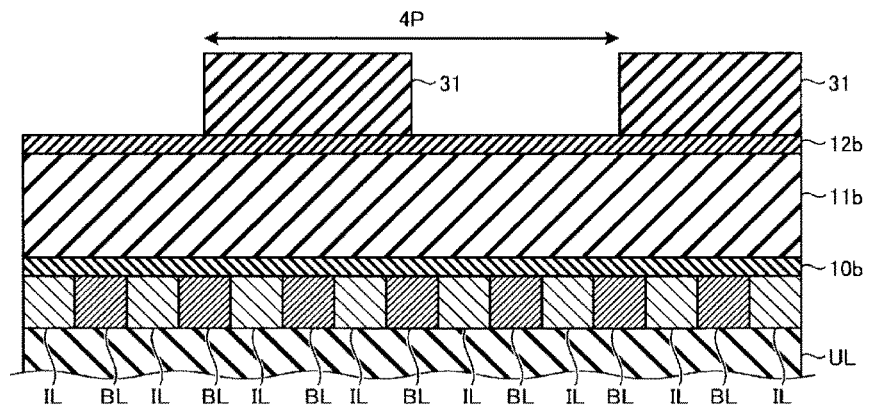
FIGS. 6A and 6B depict aspects of a manufacturing process of a semiconductor device according to an embodiment

As shown in FIG. 6A, after a resist is coated over the SOG layer 12b, resist patterns 31 are formed by, for example, immersion exposure in which an ArF excimer laser is used as a light source. The resist pattern 31 forms a pattern covering a portion of the bit lines BL extending in the Y direction arranged at a pitch 4 P in the X direction. The resist pattern 31 is preferably arranged such that one bit line BL is at a center position in the width direction (X direction) of the resist pattern 31. However, a deviation in the X direction of up to about ¼ of the pitch P (P/4) could occur.

Figure 6B:
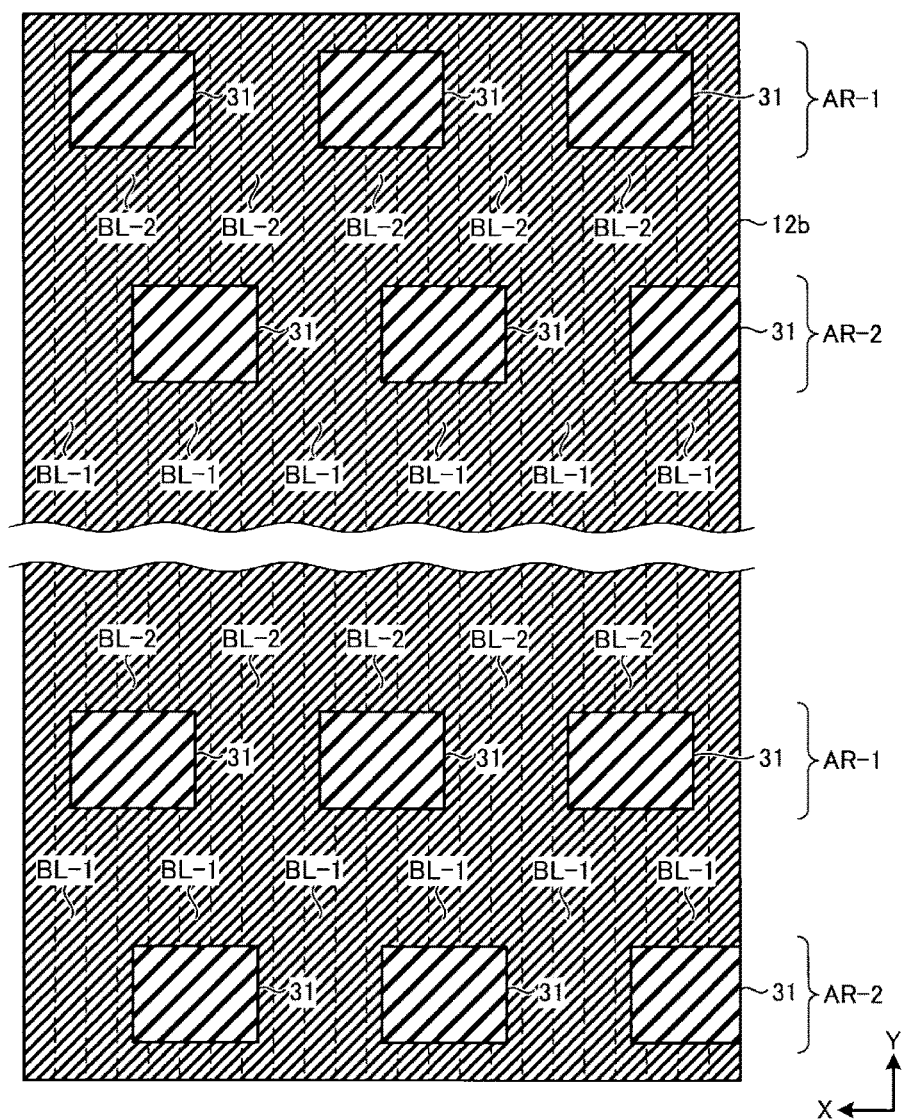

FIG. 6B shows a top view taken at this time. In the top view of FIG. 6B, a range wider than that of the cross-sectional view of FIG. 6A is shown. In the drawing, the bit lines BL are indicated by dotted lines. As shown in FIG. 6B, the resist patterns 31 are formed in island shapes in two rows at both end of the bit lines BL. At this time, the resist patterns 31 are arranged such that the arrangement of both rows deviates by a distance equal to pitch P.

Figure 7A:
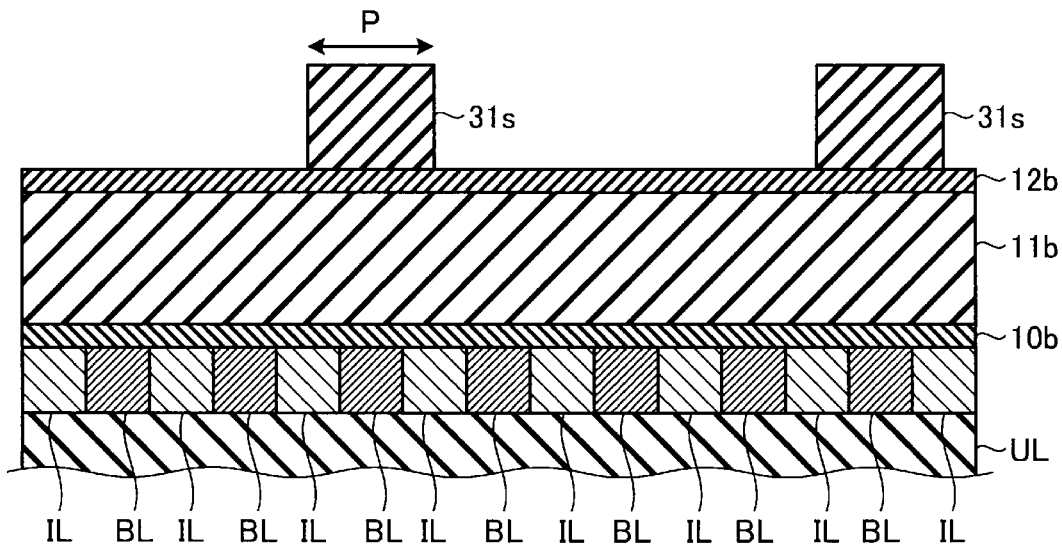
FIGS. 7A and 7B depict aspects of a manufacturing process of a semiconductor device according to an embodiment.

As shown in FIG. 7A, the resist patterns 31 are slimmed (trimmed) by, for example, O₂ plasma, and resist patterns 31s having a width in the X direction equal to the pitch P of the bit lines BL are formed.

Figure 7B:
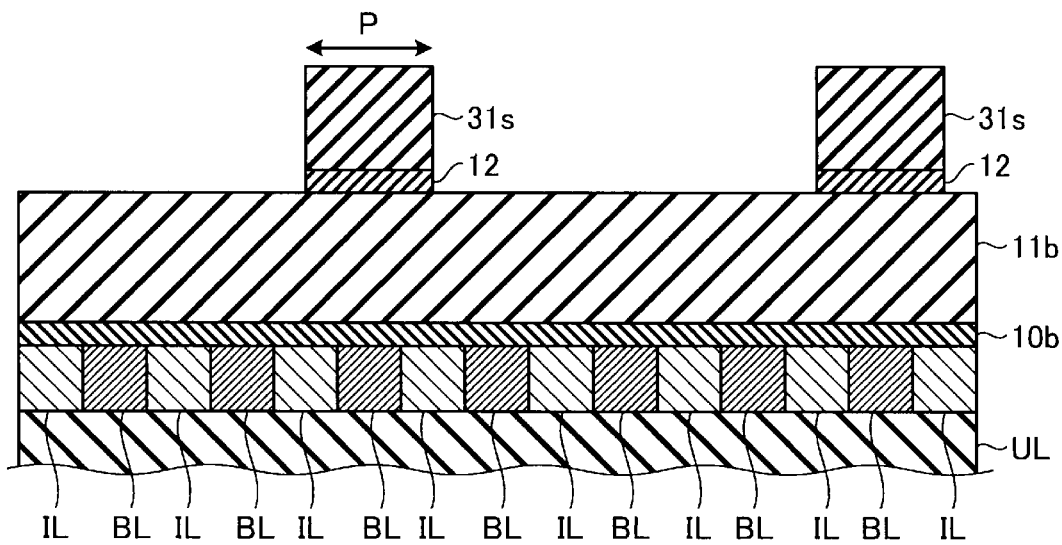

As shown in FIG. 7B, the resist patterns 31s are used as masks, and the SOG layer 12b is processed using, for example, Reactive Ion Etching (RIE) to form SOG patterns 12.

Figure 8A:
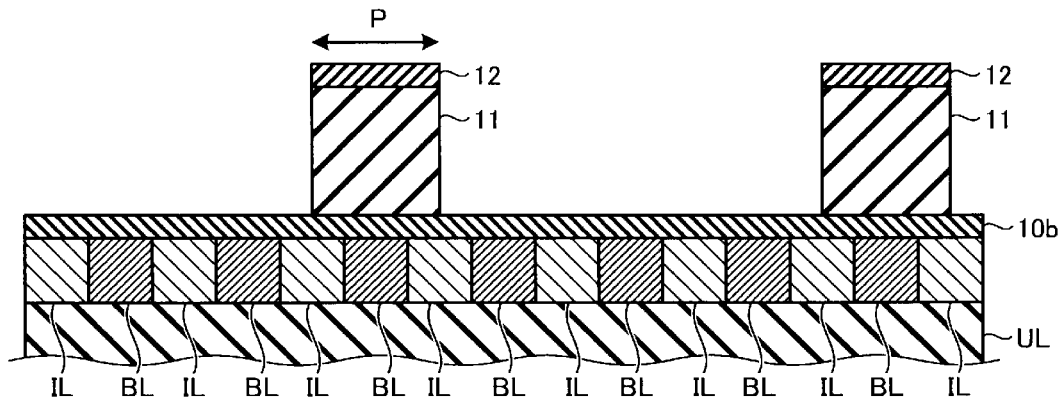
FIGS. 8A and 8B depict aspects of a manufacturing process of a semiconductor device according to an embodiment.

As shown in FIG. 8A, the SOC patterns 12 are used as masks, and SOC patterns 11, whose width in the X direction is the same as the pitch P, are formed by using RIE or the like. The width of the SOC patterns 11 in the X direction may be adjusted to be equal to the pitch P of the bit lines BL through slimming of the resist patterns 31, formation of the SOG patterns 12, and formation of the SOC patterns 11.

Figure 8B:
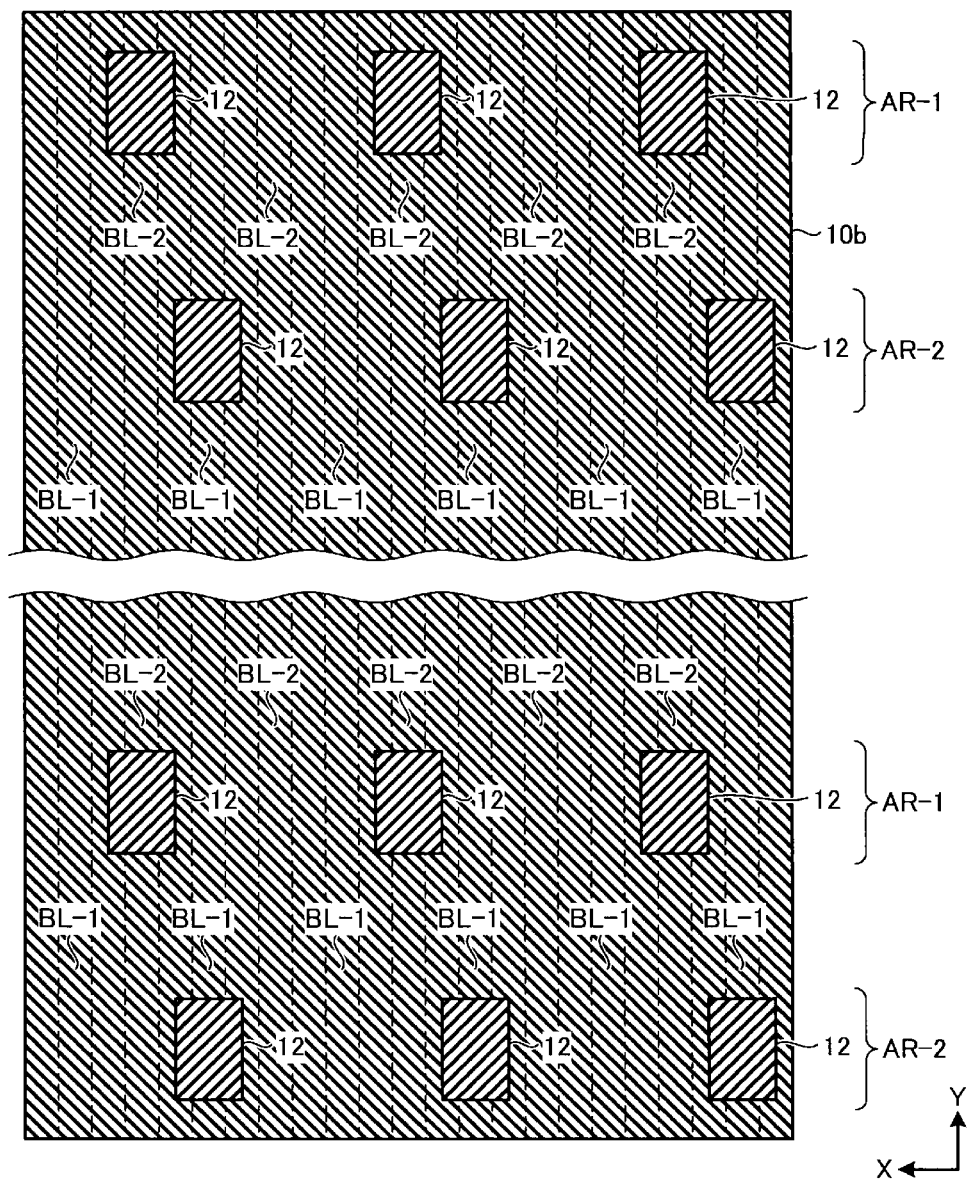

FIG. 8B shows a top view taken at this time. In the top view of FIG. 8B, a range wider than that of the cross-sectional view of FIG. 8A is shown. In the drawing, the bit lines BL are indicated by dotted lines. As shown in FIG. 8B, the SOG patterns 12 and the SOC patterns 11 are formed in island shapes in two rows at both ends of the bit lines BL, The island shapes in the different rows are offset from each other in the X-direction by a distance equal to pitch P.

As shown in FIGS. 9A and 9B, FIGS. 10A and 10B, and FIGS. 11A and 11B, the insulation layer 10b is processed by, for example, a sidewall process. As will be described below, the sidewall process is a technique for obtaining a pattern finer than the initial SOC pattern 11 by using the SOC pattern 11 as a core material.

Figure 9A:
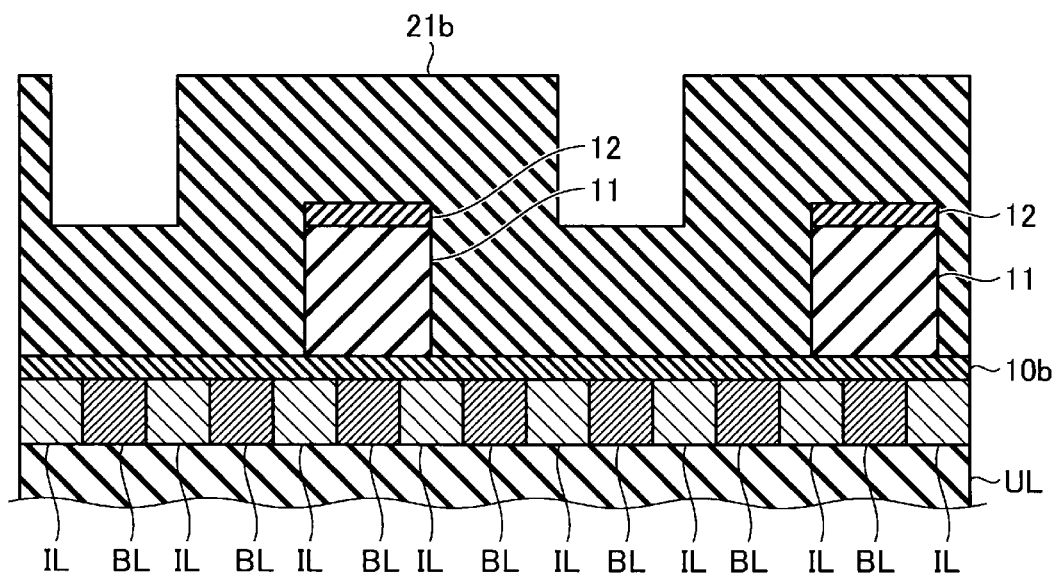
FIGS. 9A and 9B depict aspects of a manufacturing process of a semiconductor device according to an embodiment.

As shown in FIG. 9A, an insulation layer 21b that covers the SOG patterns 12 and the SOC patterns 11 is formed on the insulation layer 10b by, for example, CVD. The insulation layer 21b is, for example, a SiN layer. The insulation layer 21b, for example, has a layer thickness equal to the width of the SOC pattern 11 in the X direction.

Figure 9B:
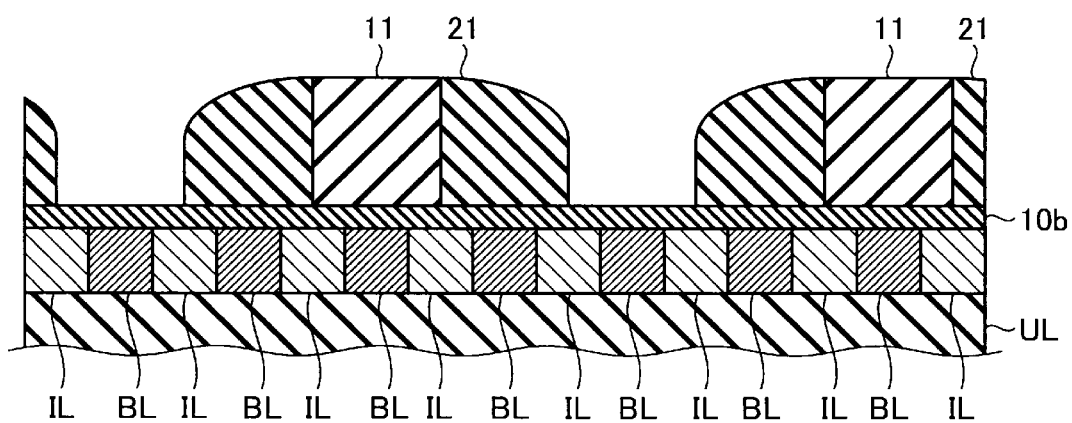

As shown in FIG. 9B, the insulation layer 21b is thinned by etch back using, for example, RIE, to form an insulation layer pattern 21, with the SOC patterns 11 as a core material now exposed.

Figure 10A:
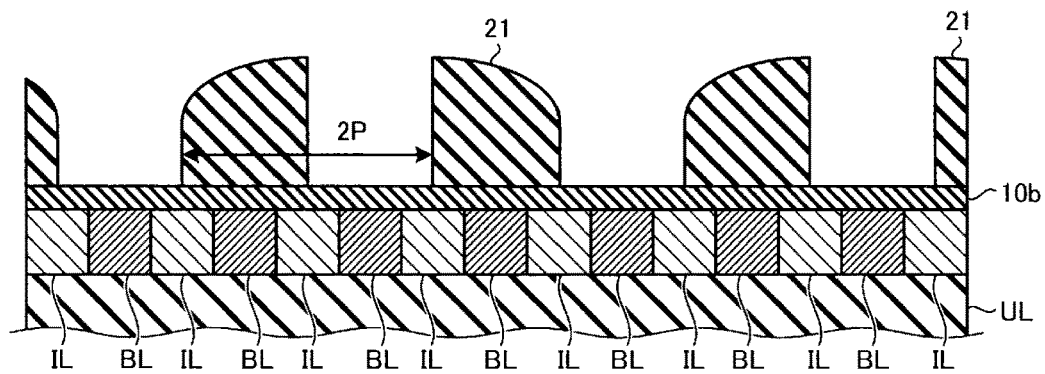
FIGS. 10A and 10B depict aspects of a manufacturing process of a semiconductor device according to an embodiment.

As shown in FIG. 10A, the exposed SOC patterns 11 are removed. Accordingly, the insulation layer pattern 21 that has a line width in the X direction twice that of the bit line BL and has a pitch 2 P in the X direction twice that of the bit lines BL is formed.

Figure 10B:
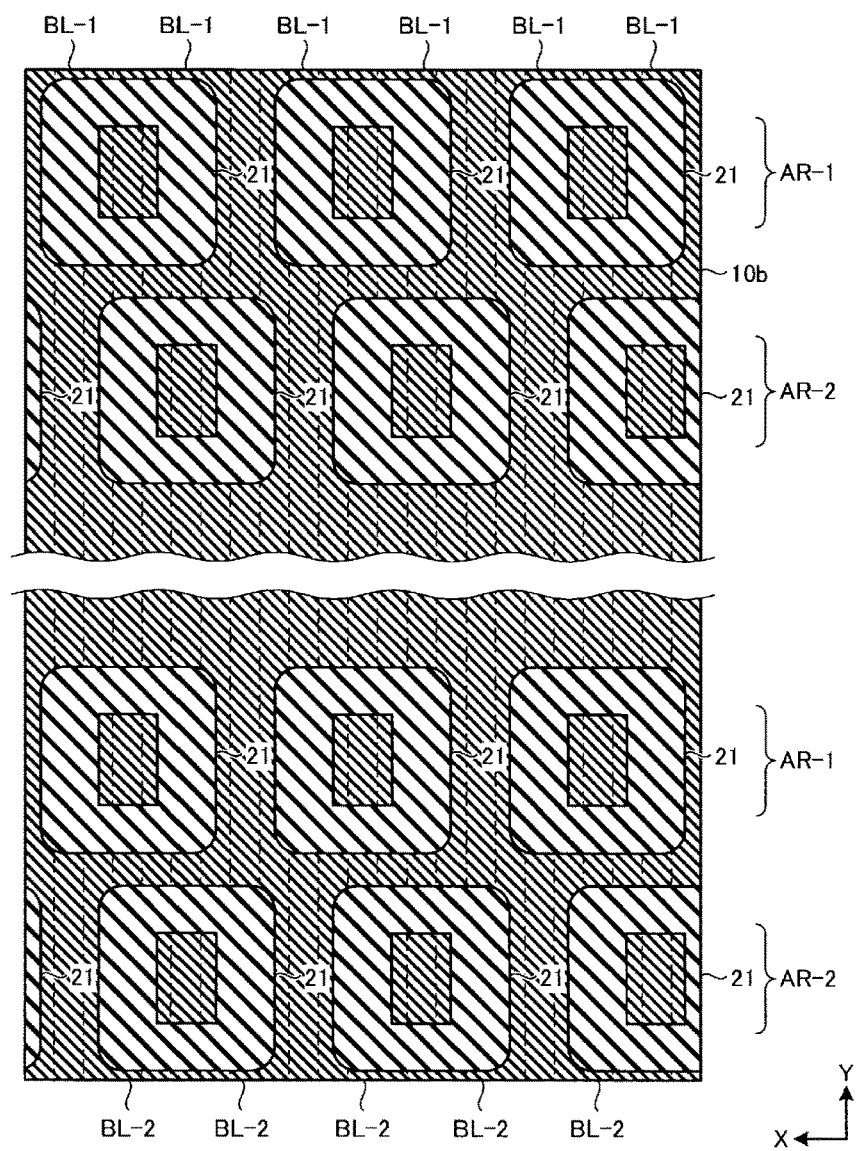

FIG. 10B shows a top view taken at this time. In top view of FIG. 10B, a range wider than that of the cross-sectional view of FIG. 10A is shown. In the drawing, the bit lines are indicated by dotted lines. As shown in FIG. 10B, the insulation layer pattern 21 is in a ring shape when viewed from above, with the SOC pattern 11 removed to leave a hole therein.

Figure 11A:
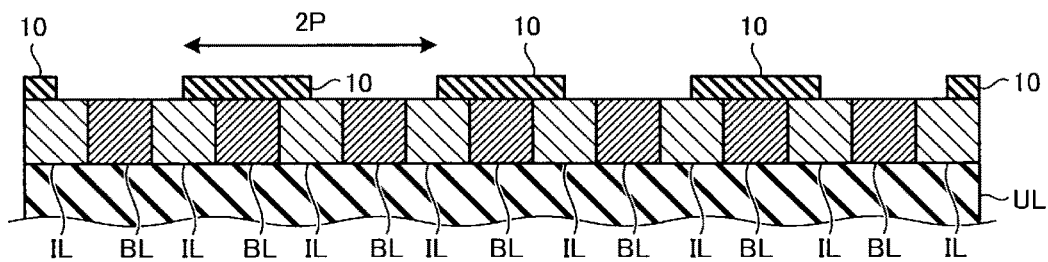
FIGS. 11A and 11B depict aspects of a manufacturing process of a semiconductor device according to an embodiment.

As shown in FIG. 11A, the insulation layer pattern 21 is used as a mask, the insulation layer 10b is processed by using, for example, RIE, and then the insulation layer pattern 21 is removed by, for example, wet processing. Accordingly, the guide layer 10 that has a line width in the X direction twice that of the bit line BL and has a pitch 2 P in the X direction twice that of the bit line BL is formed.

Figure 11B:
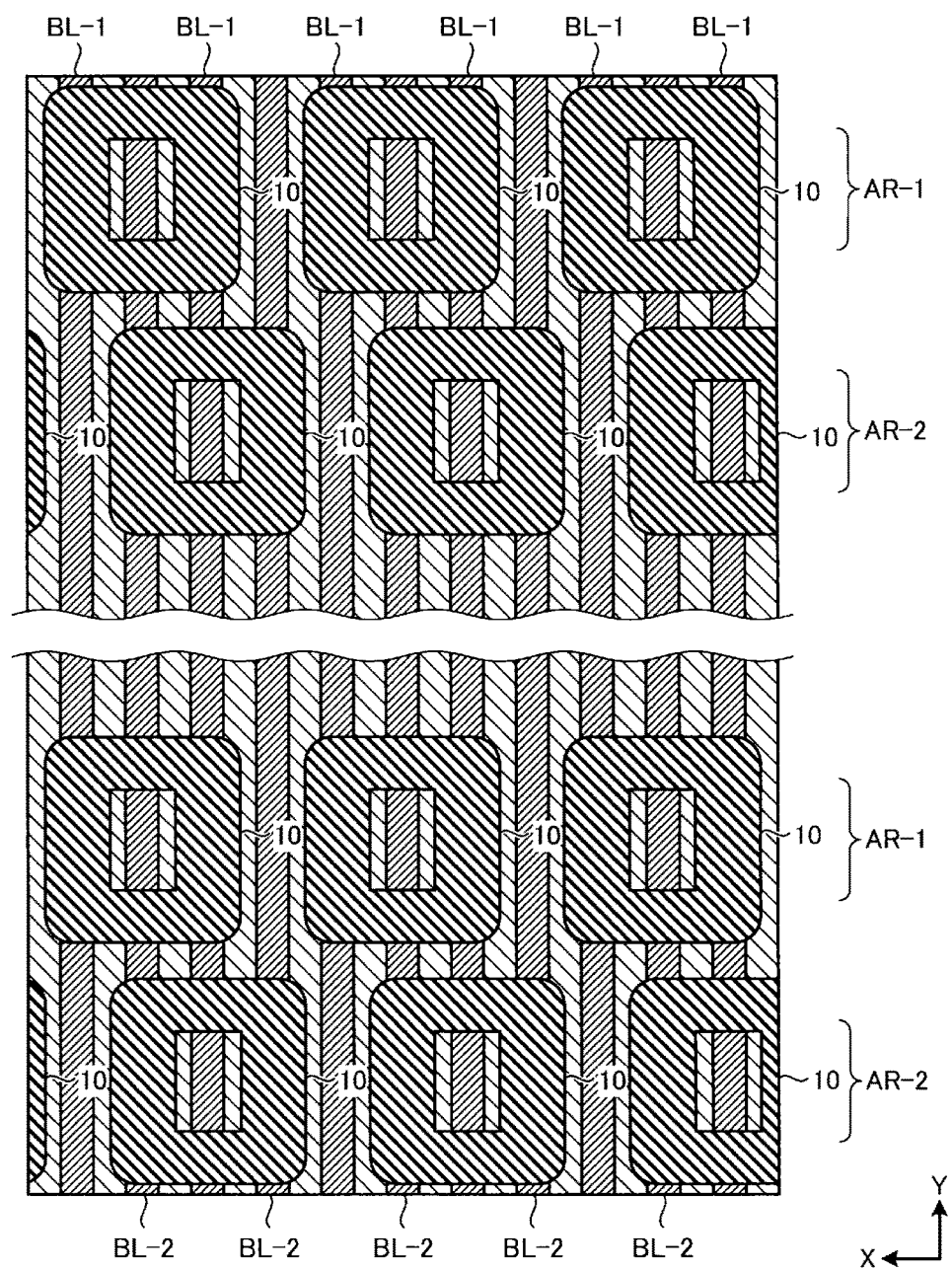

FIG. 11B shows a top view taken at this time. In the top view of FIG. 11B, a range wider than that of the cross-sectional view of FIG. 11A is shown. As shown in FIG. 11B, the guide layer 10 is in a ring shape like the insulation layer pattern 21 when viewed from above. At this time, the bit line BL-2 is exposed in an area corresponding to the area AR-1, and the bit line BL-1 is exposed in an area corresponding to the area AR-2.

The guide layer 10, which has a line width in the X direction equal to that of the SOC pattern 11 and a pitch 2 P (½ of the pitch 4 P) in the X direction, can be obtained by the sidewall process shown in FIGS. 9A and 9B, FIGS. 10A and 10B, and FIGS. 11A and 11B from the SOC pattern 11 with a line width in the X direction equal to the pitch P and a pitch 4 P equal to that of the original resist pattern 31.

Figure 12A:
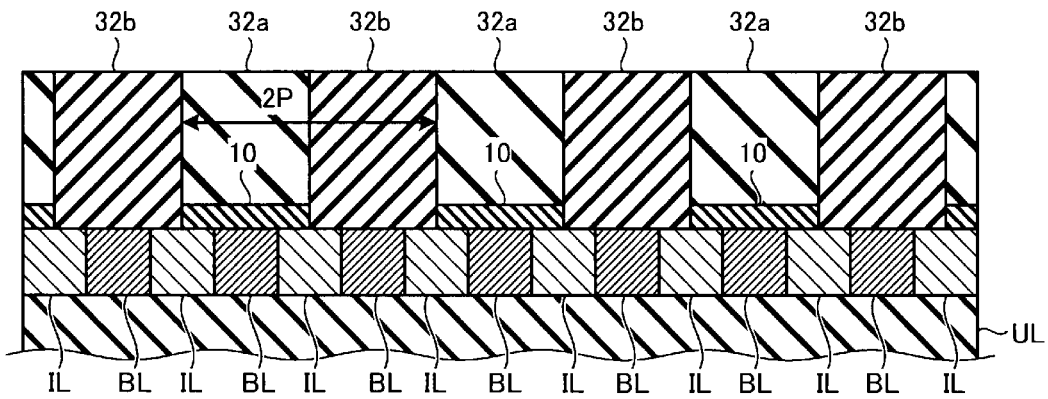
FIGS. 12A and 12B depict aspects of a manufacturing process of a semiconductor device according to an embodiment.
Figure 12B:
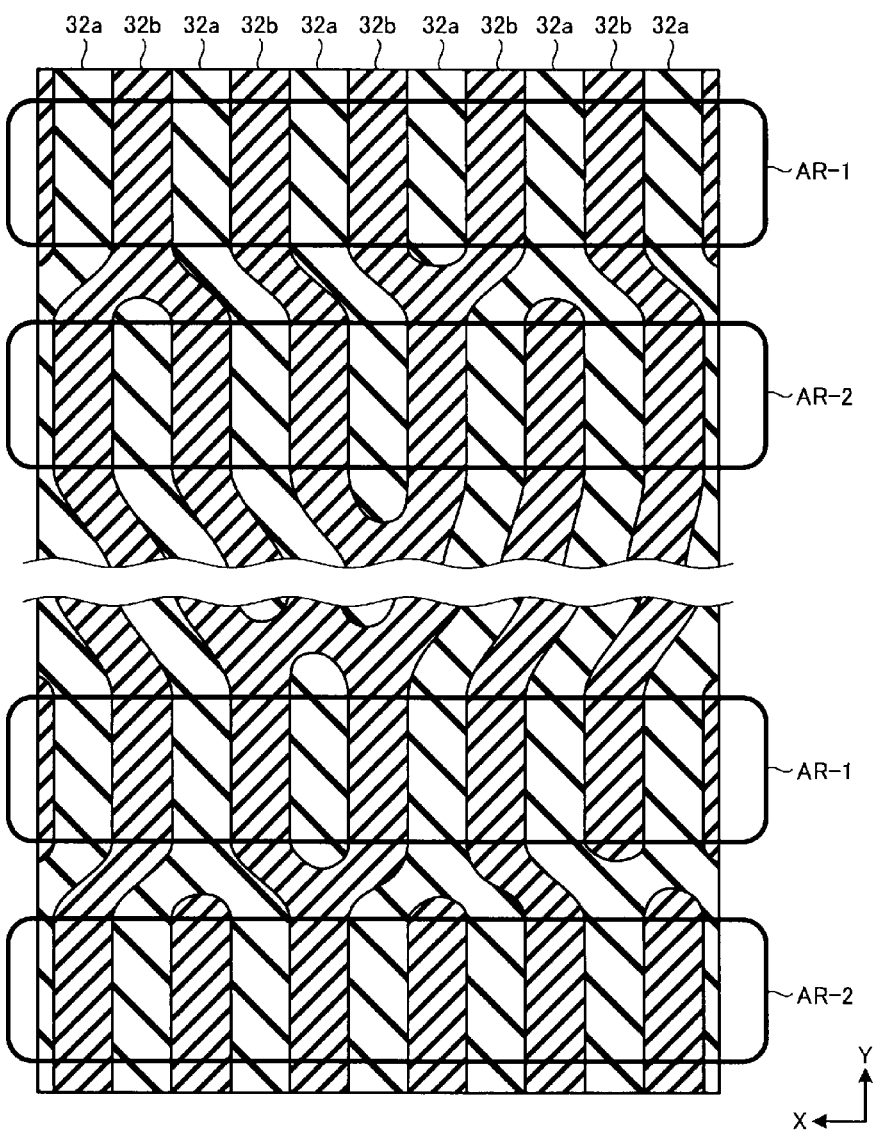

As shown in FIGS. 12A and 12B, a pattern is formed by using directed self-assembly lithography. Directed self-assembly lithography is a technique for obtaining a fine pattern by using a self-segregating Block Co-Polymer (BCP).

In the following examples, polystyrene-block-polymethyl methacrylate (PS-b-PMMA) is used as the block co-polymer. The block co-polymer type and parameters may be selected in accordance with a target value of pitch in the desired pattern. In this example, the target value is equal to pitch 2 P.

First, by, for example, spin coating, the PS-b-PMMA is coated over the bit line BL, the interlayer insulation layer IL, and the guide layer 10. The coating thickness of the PS-b-PMMA may be, for example, 30 nm to 90 nm. Then, the PS-b-PMMA is heated at a predetermined temperature for a predetermined time in a nitrogen atmosphere and phase-separates.

The bit line BL (formed of a metal such as W) and the guide layer 10 (formed of an insulation material such as SiO₂) have different surface energies. Therefore, the guide layer 10 functions as a chemical guide pattern in the directed self-assembly of the PS-b-PMMA. More specifically, PS in the PS-b-PMMA preferentially aligns onto the guide layer 10 due the guide layer 10 being a hydrophobic guide pattern. On the other hand, PMMA has a high affinity with the more hydrophilic bit line BL, and thus preferentially aligns on the bit lines BL.

FIG. 12A shows blocks 32a of PS and blocks 32b of PMMA which are formed in a self-aligning manner as described above. The blocks 32a, 32b arrange in a self-aligning manner to already formed materials below. Therefore, as shown in FIG. 12A, the blocks 32a, 32b alternately arrange on the adjacent bit lines BL even when a positional deviation (e.g., about P/4) occurs during the forming the resist pattern 31 (shown in FIGS. 6A and 6B).

FIG. 12B shows a top view. In the top view of FIG. 12B, a range wider than that of the cross-sectional view of FIG. 12A is shown. As shown in FIG. 12B, in the areas AR-1, AR-2, since the guide layers 10 are arranged at the pitch 2 P, the blocks 32a, 32b are also periodically arranged at pitches 2 P. On the other hand, outside the areas AR-1 and AR-2, the guide layer 10 deviates from the pitch 2 P or the guide layer 10 does not exist. Therefore, the PS-b-PMMA does not self-assembly to match the target pitch 2P, and the blocks 32a, 32b generally do not have a periodic arrangement outside the areas AR-1 and AR-2. That is, the blocks 32a, 32b are randomly disposed while still maintaining the pitch 2 P due to the selected parameters of the block copolymer.

By the directed self-assembly lithography shown in FIGS. 12A and 12B, a pattern is obtained in which the blocks 32a, 32b are periodically arranged at the pitch 2 P in the areas AR-1, AR-2 and outside the areas AR-1, AR-2, the blocks 32a, 32b are randomly arranged while generally maintaining pattern dimensions corresponding to the pitch 2 P.

Figure 13A:
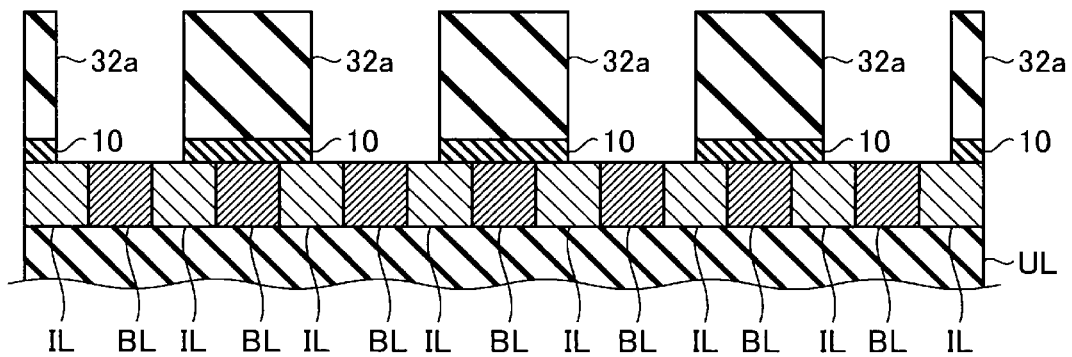
FIGS. 13A, 13B, and 13C depict aspects of a manufacturing process of a semiconductor device according to an embodiment.

As shown in FIG. 13A, the blocks 32b are selectively removed by using, for example, RIE.

Figure 13B:
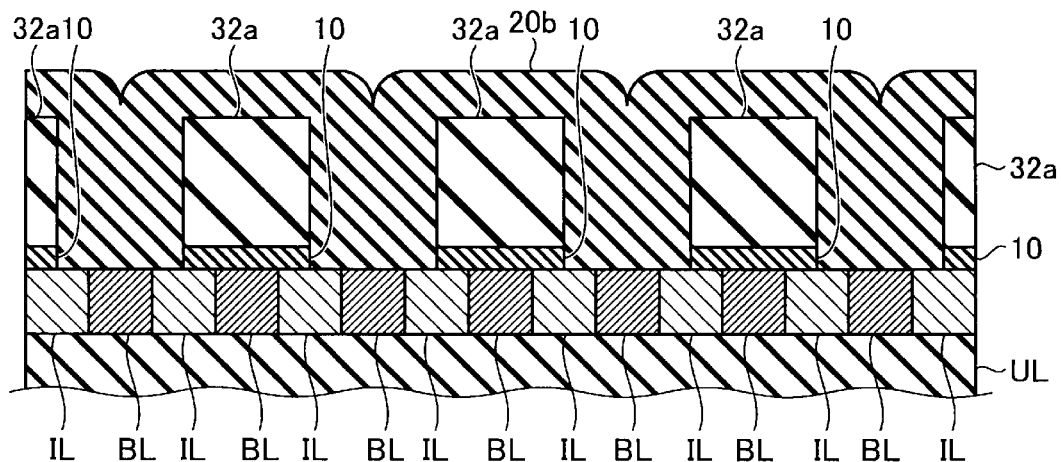

As shown in FIG. 13B, an insulation layer 20b covering the blocks 32a is formed on the bit lines BL and the interlayer insulation layers IL by, for example, CVD. The insulation layer 20b has a layer thickness sufficient to fill the space between the blocks 32a, for example, half of the pitch of the blocks 32a (so a layer thickness equal to pitch P). The insulation layer 20b is, for example, a SiN layer.

Figure 13C:
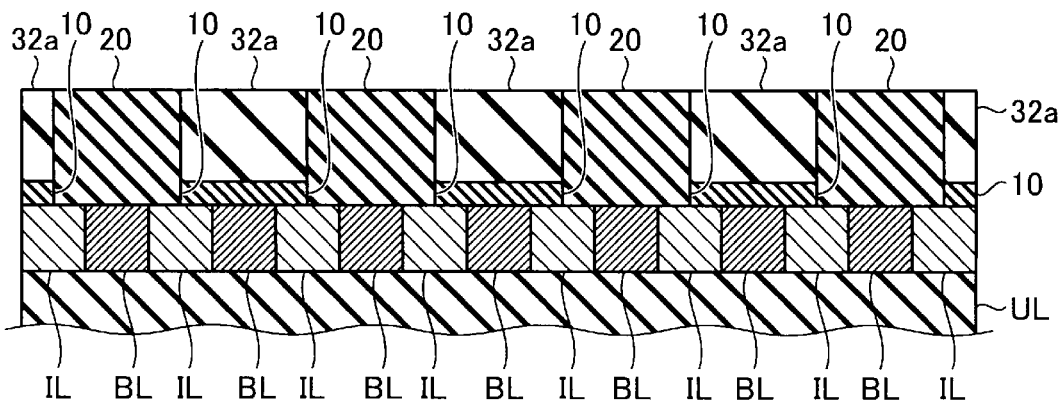

As shown in FIG. 13C, the insulation layer 20b is planarized by, for example, CMP to expose an upper surface of the blocks 32a. After this planarization, the insulation layer 20b is divided by the blocks 32a and thus forms the stopper layers 20.

Figure 14A:
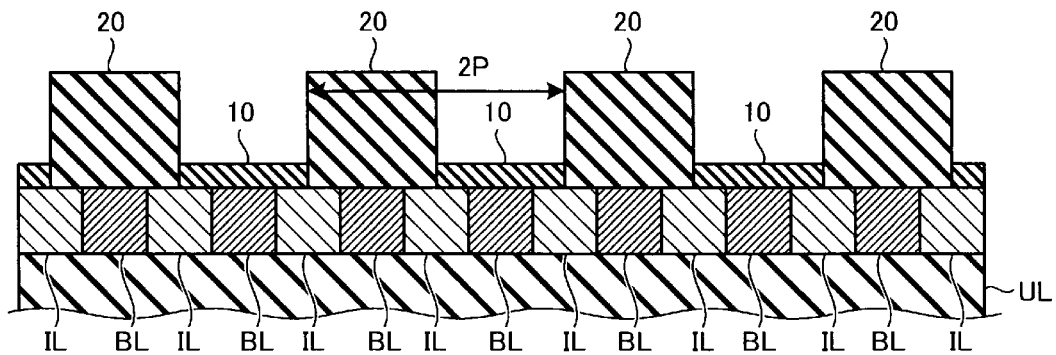
FIGS. 14A and 14B depict aspects of a manufacturing process of a semiconductor device according to an embodiment.

As shown in FIG. 14A, the now exposed blocks 32a are removed by, for example, O₂ ashing. Accordingly, the stopper layer 20 having a pitch 2 P in the X direction is obtained.

Figure 14B:
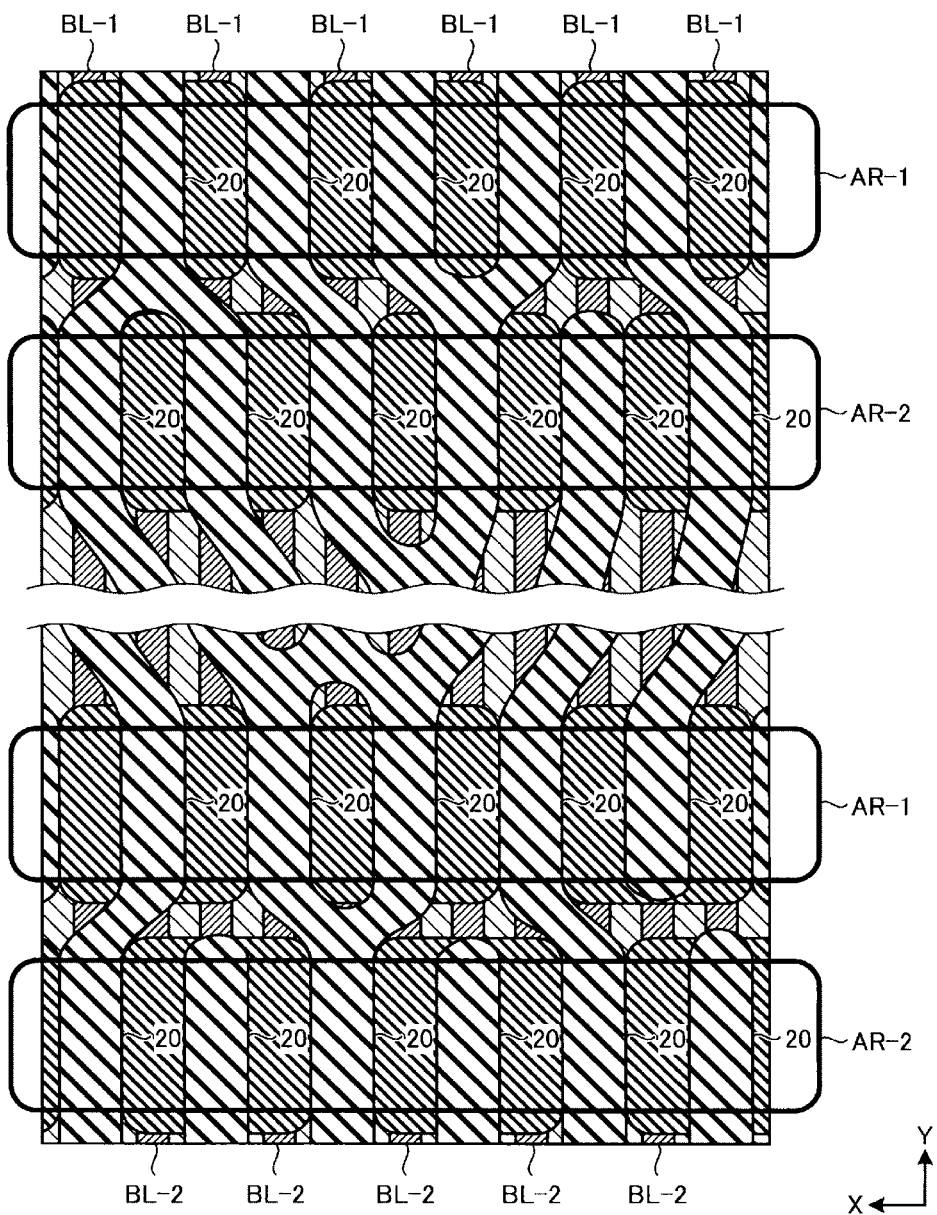

FIG. 14B shows a top view. In the top view of FIG. 14B, a range wider than that of the cross-sectional view of FIG. 14A is shown. The stopper layers 20 are formed at positions coinciding with the previously removed blocks 32b, and have a pattern matching that of the blocks 32b. That is, a pattern is obtained in which, in the areas AR-1, AR-2, the stopper layers 20 are periodically arranged at the pitch 2 P, and outside the areas AR-1, AR-2, the stopper layers 20 are randomly disposed while maintaining the pitch 2 P. At this time, stopper layers 20 in the area AR-1 cover the bit lines BL-2, and stopper layers 20 in the area AR-2 cover the bit lines BL-1.

Figure 15A:
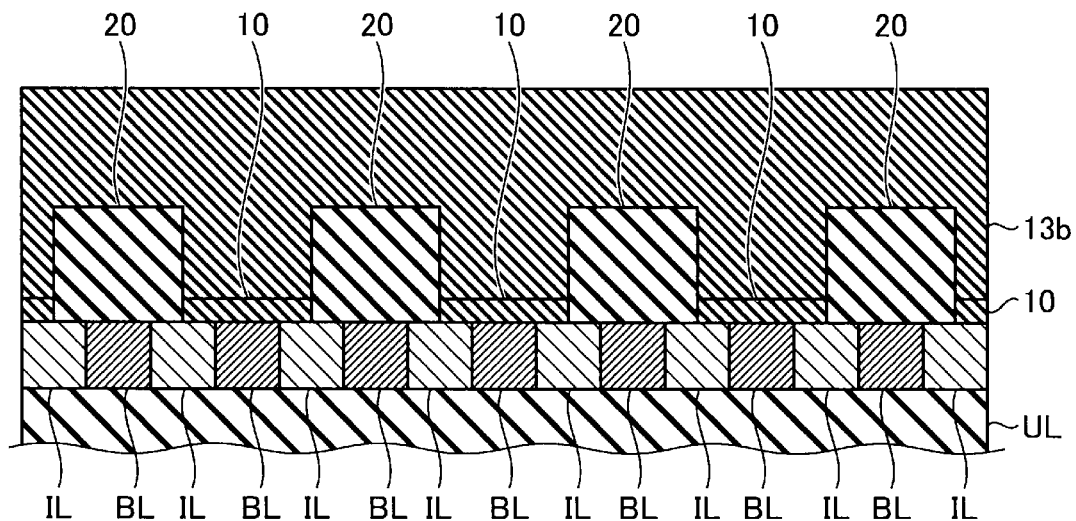
FIGS. 15A and 15B depict aspects of a manufacturing process of a semiconductor device according to an embodiment.

As shown in FIG. 15A, an insulation layer 13b that covers the guide layers 10 and the stopper layers 20 is formed with a desired layer thickness by, for example, CVD.

Figure 15B:
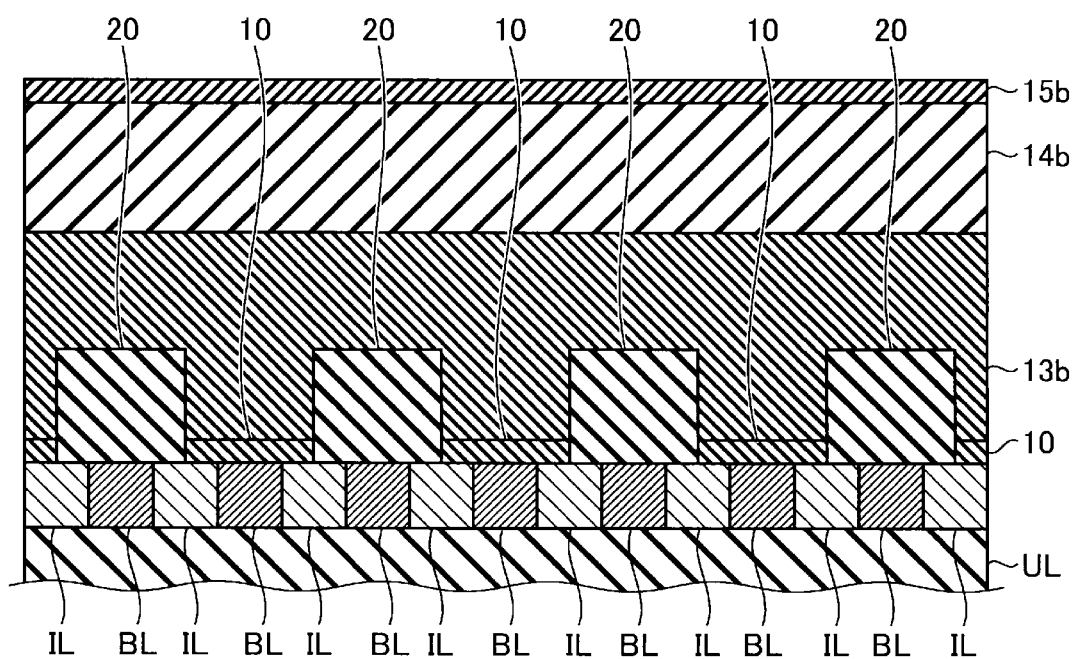

As shown in FIG. 15B, an SOC layer 14b is formed by, for example, spin coating. On the SOC layer 14b, an SOG layer 15b is formed by, for example, spin coating.

Figure 16A:
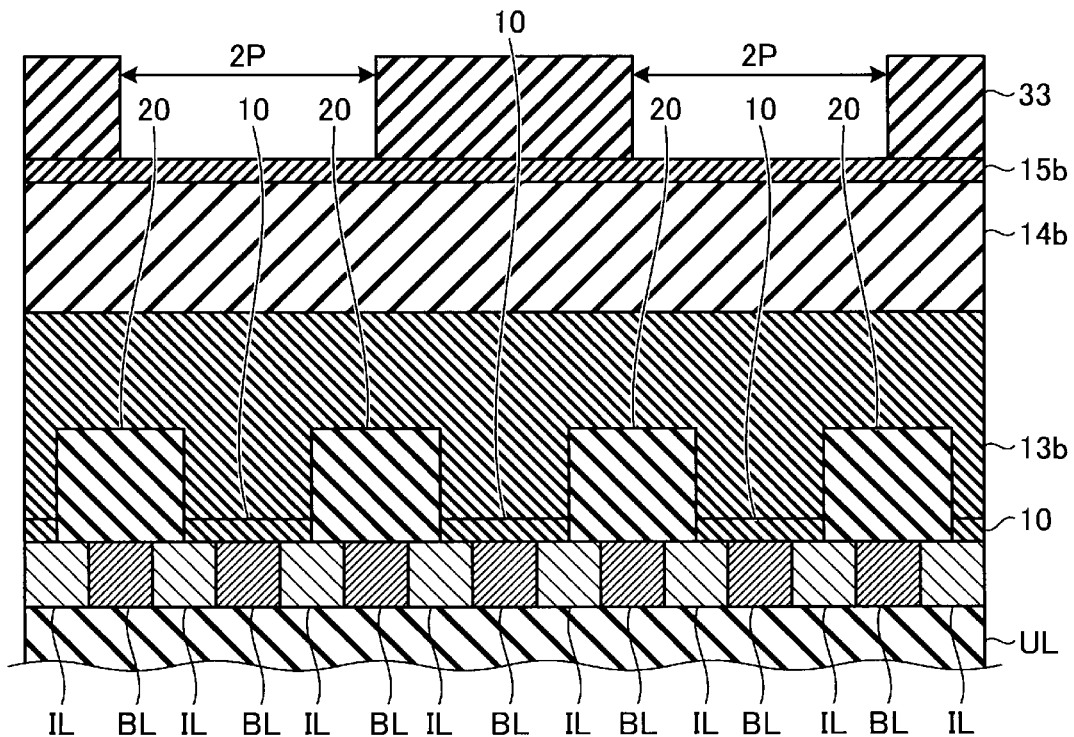
FIGS. 16A and 16B depict aspects of a manufacturing process of a semiconductor device according to an embodiment.

As shown in FIG. 16A, a resist is coated over the SOG layer 15b, and a resist pattern 33 is formed by, for example, immersion exposure in which an ArF excimer laser is used as a light source. The resist pattern 33 has a hole pattern. The holes in the resist pattern 33 having a diameter twice the pitch P of the bit lines BL at positions corresponding to the contacts CT-1, CT-2, CT-3, CT-4 shown in FIG. 4. At this time, the resist pattern 33 is preferably arranged such that a bit line BL is at a center of each hole (opening) of the resist pattern 33. However, a shift in the X direction of about P/2 is acceptable.

Figure 16B:
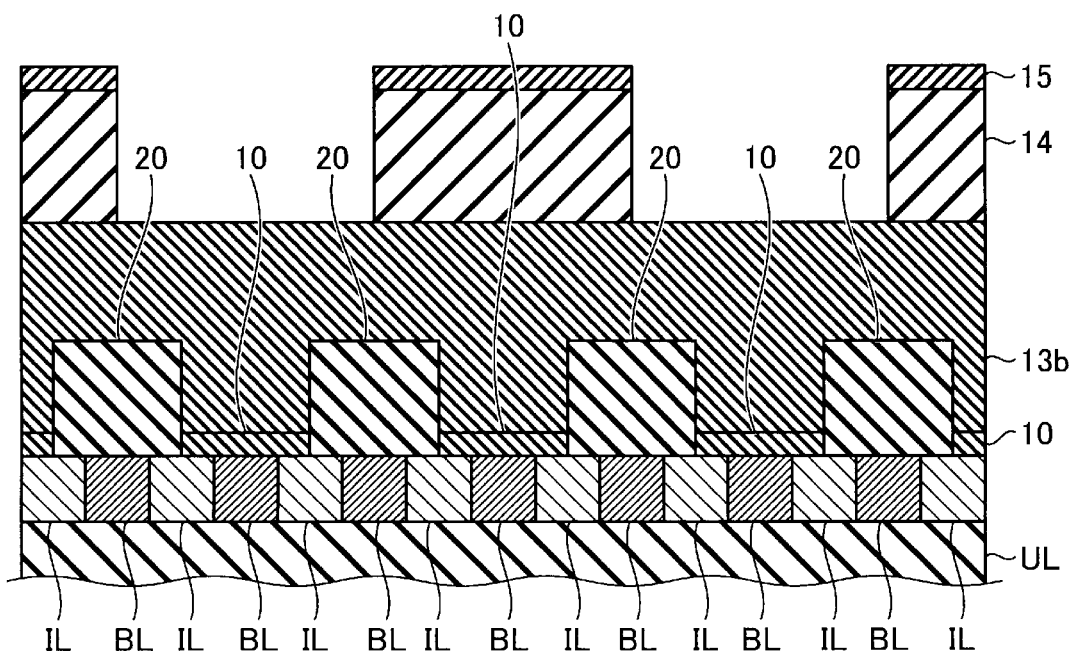

As shown in FIG. 16B, the resist patterns 33 are used as masks, and the SOG layer 15b and the SOC layer 14b are processed using RIE or the like to form SOG pattern 15 and SOC pattern 14 corresponding to hole pattern of the resist patterns 33.

Figure 17A:
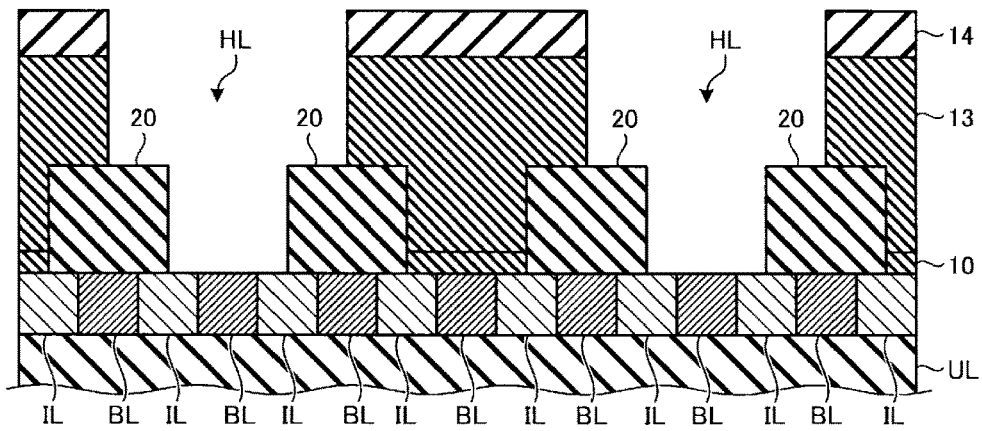
FIGS. 17A and 17B depict aspects of a manufacturing process of a semiconductor device according to an embodiment.

As shown in FIG. 17A, the SOC pattern 14 is used as a mask, and the insulation layer 13b is processed using, for example, RIE to form the interlayer insulation layer 13. In the etch processing, insulation layer 13b is selectively removed while the stopper layer 20 is not. To obtain etch selectivity between the insulation 13b and the stopper layer 20, a mixed gas of C₄F₈, O₂ and Ar, a mixed gas of C₄F₆, O₂ and Ar, or a mixed gas of C₄F₈, C₄F₆, O₂ and Ar may be used when the stopper layer 20 is silicon nitride or the like and the insulation layer 13b is silicon oxide or the like.

In this manner, in the opening of the SOC pattern 14, the stopper layer 20 is not completely removed, while the insulation layer 13b and the guide layer 10, which is made of a same material as that of the insulation layer 13b, are both removed. A hole HL is formed between the stopper layers 20.

Figure 17B:
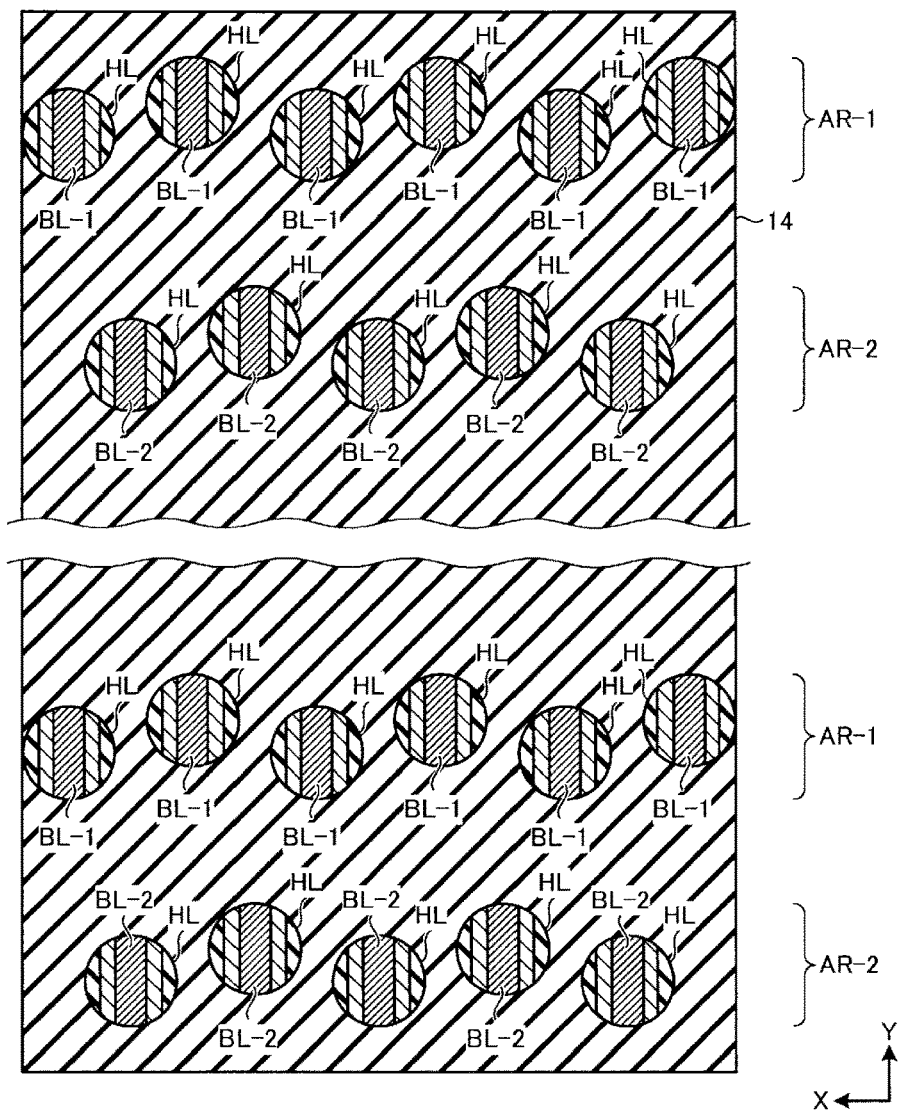

FIG. 17B shows a top view taken. In the top view of FIG. 17B, a range wider than that of the cross-sectional view of FIG. 17A is shown. As shown in FIG. 17B, the SOC pattern 14 and the underlying interlayer insulation layer 13 have the holes HL in the positions of the contacts CT-1, CT-2, CT-3, CT-4 shown in FIG. 4. At this time, in the area AR-1, only one of the plurality of bit lines BL-1 is exposed in each hole HL. In the area AR-2, only one of the plurality of bit lines BL-2 is exposed in each hole HL.

Subsequently, the SOC pattern 14 is removed, and a conductive material, such as tungsten (W), is embedded in the holes HL to form the contacts CT-1, CT-2, CT-3, CT-4. In this way, the manufacturing process of the semiconductor device 1 is completed.

(Comparative Example)

In a memory device in which storage elements are arranged in an array, or in a logic device in which logic elements are arranged in an array, wiring connected to these elements may take on a fine, narrow-pitched and periodic arrangement such as a line-and-space structure. When connecting a contact to such wiring, an electrode pad or the like having a size larger than that of the wiring is led out from the wiring, and the electrode pad and the contact are connected to each other, thereby obtaining an indirect electrical connection between the wiring and the contact. For this reason, it is required to secure a space for disposing the electrode pad at outside of the cell array or the like, and thus the size of the semiconductor device is increased or the area of the device occupiable by the cell array is reduced. In a configuration in which a memory cell and wiring connected to the memory cell are stacked in a multilayer manner, such as the cross-point type memory, such an adverse effect appears even more significantly.

However, it is generally very difficult to connect a contact directly to fine and narrow-pitched wiring that has a periodic arrangement. This is because positional shifts often occurs when it is attempted to form a contact directly on each fine wiring. When the positional shift of the contact with respect to the wiring occurs, the contact and wiring adjacent thereto may be short-circuited or misconnected. In addition, the process of reducing the final size from the size by lithography using a Hole Shrink process or the like has a narrow process margin, leading to a decrease in yield.

In the semiconductor device 1 of the embodiment, the contacts are directly connected to a bit line BL while unintended contact between the contact with the adjacent bit lines BL is avoided by the presence of the stopper layer(s) 20. Accordingly, it is not required to lead out to an electrode pad having a larger size than the bit line BL, and thus the area of the cell array can be increased, and the size of the semiconductor device 1 can be reduced.

In the semiconductor device 1 of the embodiment, a contact having a diameter larger than the pitch P of the bit line BL can be directly connected to the bit line BL. In addition, even when a slight positional shift occurs in the resist pattern 33 at the time of forming the contact, contact with other bit lines BL is prevented by the stopper layer 20, so problems associated with positional shift can be reduced.

In the semiconductor device 1 of the embodiment, the stopper layer 20 is formed by using directed self-assembly lithography. Accordingly, the stopper layer 20 can be reliably disposed on desired bit lines BL, and a short circuit between the contact and the bit lines BL adjacent to the bit line BL connected to the contact can be prevented.

In the semiconductor device 1 of the embodiment, the guide layer 10, which is a guide pattern used in the directed self-assembly lithography, is formed by, for example, a sidewall process. Accordingly, the fine and narrow-pitched guide layer 10 can be obtained more easily. Even when a slight positional shift occurs in the resist pattern 31 used for forming the guide layer 10, the influence of the positional shift can be reduced by using the directed self-assembly lithography thereafter.

In the above example embodiment, the memory cell has a structure in which the non-ohmic element NO, the variable resistance element VR, and the electrode EL are stacked in this order from the bit line side toward the word line side, but the present disclosure is not limited thereto. The memory cell may have a structure in which the electrode, the variable resistance element, and the non-ohmic element are stacked in this order from the bit line side toward the word line side. The current density in the variable resistance element may be increased by progressively reducing cross-sectional areas of the non-ohmic element, the variable resistance element and the electrode.

In the example embodiment, the guide layer 10 is formed by using a sidewall process, but the present disclosure is not limited thereto. The guide layer may be formed by using directed self-assembly lithography, nanoimprint techniques, an EUV exposure technique, or other available patterning techniques.

In the example embodiment, the semiconductor device 1 is a cross-point type memory, but the present disclosure is not limited thereto. The concepts of the example embodiment may be applied to fine and narrow-pitched wiring having a periodic arrangement in a memory device, a logic device having transistors, or any microelectronic devices.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a first periodic pattern comprising first line portions that extend in a first direction and are spaced from each other in a second direction intersecting the first direction at a first interval;
a second periodic pattern comprising second line portions that extend in the first direction and are spaced from each other in the second direction at the first interval, the second line portions being between the first line portions in the second direction at one-half the first interval;
a third pattern above the first and the second periodic patterns in a third direction intersecting the first and second directions, in a first area of the third pattern, the third pattern includes third line portions spaced from each other in the second direction at the first interval, the third line portions being directly above the second line portions in the third direction within the first area, and in a second area of the third pattern spaced from the first area in the first direction, the third pattern includes fourth line portions spaced from each other in the second direction at the first interval, the fourth line portions being directly above the first line portions in the third direction within the second area;
a first contact between the third line portions in the first area and connected to a first line portion of the first pattern; and
a second contact between the fourth line portions in the second area and connected to a second line portion of the second pattern.

2. The semiconductor device according to claim 1, wherein the third pattern includes irregular pattern portions outside of the first and second areas.

3. The semiconductor device according to claim 2, wherein the irregular pattern is a fingerprint-type pattern.

4. The semiconductor device according to claim 2, wherein the irregular pattern has a shape resulting from self-assembly lithography processing.

5. The semiconductor device according to claim 1, wherein the third pattern is a material having a greater reactive ion etching resistance in a fluorocarbon etch chemistry than silicon dioxide.

6. The semiconductor device according to 5, wherein the third pattern comprises silicon nitride.

7. The semiconductor device according to 1, wherein the third pattern comprises silicon nitride.

8. The semiconductor device according to claim 1, further comprising:
a first memory cell connected to a line portion in the first periodic pattern; and
a second memory cell connected to a line portion in the second periodic pattern.

9. The semiconductor device according to claim 8, further comprising:
a plurality of word lines above the third pattern in the third direction, wherein the first memory cell is connected to a first word line in the plurality of word lines and the second memory cell is connected to either the first word line or a second word line in the plurality of word lines.

10. A semiconductor device, comprising:
a first pattern including first line portions extending in a first direction the first line portions being spaced from each other at a first pitch distance in a second direction intersecting with the first direction;
a second pattern including second line portions extending in the first direction, each second line portion being between pairs of the first line portions in the second direction and spaced from each other at the first pitch distance in the second direction;
a plurality of first contacts in a first area connected to every other one of the first line portions of the first pattern;
a plurality of second contacts in the first area connected to the first line portions not connected to any one of the first contacts, the first contacts being aligned in a first row along the second direction, the second contacts being aligned in a second row offset from the first row in the first direction;
a plurality of third contacts in a second area spaced from the first area in the first direction, the third contacts being connected to every other one of the second line portions of the second pattern;
a plurality of fourth contacts in the second area connected to the second line portions not connected to any one of the third contacts, the third contacts being aligned in a third row along the second direction, the fourth contacts being aligned in a fourth row offset from the first in the first direction;
a guide pattern layer in the first and second areas, the guide pattern layer covering alternating ones of the first line portions along the first row and offset alternating ones of the first line portion along the second row in the first area, and alternating ones of the second line portions along the third row and offset alternating ones of along fourth row in the second area; and a stopper layer covering the second line portions in the first area and the first line portions in the second area, the stopper layer having periodic portions spaced from each other at the first pitch distance.

11. The semiconductor device according to claim 10, wherein the stopper pattern includes irregular pattern portions outside of the first and second areas.

12. The semiconductor device according to claim 11, wherein the irregular pattern is a fingerprint-type pattern.

13. The semiconductor device according to claim 11, wherein the irregular pattern has a shape resulting from self-assembly lithography processing.

14. The semiconductor device according to claim 10, wherein the stopper pattern is silicon nitride.

15. A semiconductor device, comprising: a first wiring and a second wiring that extend in a first direction and are spaced from each other at a first pitch distance in a second direction intersecting with the first direction; a first stopper layer that extends in the first direction along the second wiring in a first area above the first and second wirings; a second stopper layer that extends in the first direction along the first wiring in a second area above the first and second wirings, the second area being spaced from the first area in the first direction; a first contact in the first area on the first wiring and the first stopper layer and electrically connected to the first wiring; and a second contact in the second area on the second wiring and the second stopper layer and electrically connected to the second wiring.

16. The semiconductor device according to claim 15, wherein the first and second stopper layers includes irregular pattern portions outside of the first and second areas.

17. The semiconductor device according to claim 16, wherein the irregular pattern is a fingerprint-type pattern.

18. The semiconductor device according to claim 16, wherein the irregular pattern has a shape resulting from self-assembly lithography processing.

19. The semiconductor device according to claim 15, wherein the first and second stopper layers are a material having a greater reactive ion etching resistance in a fluorocarbon etch chemistry than silicon dioxide.

20. The semiconductor device according to 15, wherein at least one of the first and second stopper layers comprises silicon nitride.

* * * * *